United States Patent
Fornes et al.

(10) Patent No.: US 9,007,739 B2
(45) Date of Patent: Apr. 14, 2015

(54) LIGHTNING STRIKE PROTECTION SYSTEM

(75) Inventors: Timothy D. Fornes, Apex, NC (US); Seth B. Carruthers, Raleigh, NC (US); Christopher J. Cox, Raleigh, NC (US)

(73) Assignee: LORD Corporation, Cary, NC (US)

( * ) Notice: Subject to any disclaimer, the term of this patent is extended or adjusted under 35 U.S.C. 154(b) by 197 days.

(21) Appl. No.: 13/592,670

(22) Filed: Aug. 23, 2012

(65) Prior Publication Data

US 2013/0048331 A1 Feb. 28, 2013

Related U.S. Application Data

(60) Provisional application No. 61/527,146, filed on Aug. 25, 2011.

(51) Int. Cl.
| | |
|---|---|
| *H02H 1/00* | (2006.01) |
| *H05K 9/00* | (2006.01) |
| *B64D 45/02* | (2006.01) |
| *C09D 5/24* | (2006.01) |

(52) U.S. Cl.
CPC .............. *H05K 9/0079* (2013.01); *B64D 45/02* (2013.01); *C09D 5/24* (2013.01)

(58) Field of Classification Search
USPC .................................. 361/212, 218, 220, 117
See application file for complete search history.

(56) References Cited

U.S. PATENT DOCUMENTS

| | | | |
|---|---|---|---|
| 4,155,896 A | 5/1979 | Rennier et al. | |
| 4,349,859 A | 9/1982 | Sanders | |
| 4,522,889 A | 6/1985 | Ebneth et al. | |
| 5,352,565 A | 10/1994 | Schroeder | |
| 5,417,385 A | 5/1995 | Arnold et al. | |
| 5,470,413 A | 11/1995 | Cedarleaf | |
| 5,578,502 A * | 11/1996 | Albright et al. | 438/95 |
| 5,598,989 A * | 2/1997 | Ross et al. | 244/171.7 |
| 6,740,410 B2 | 5/2004 | Fahey et al. | |
| 6,826,828 B1 * | 12/2004 | Shen | 29/832 |

(Continued)

FOREIGN PATENT DOCUMENTS

| | | |
|---|---|---|
| EP | 0 274 899 | 7/1988 |
| EP | 0 522 663 | 1/1993 |

(Continued)

OTHER PUBLICATIONS

Gou, Jihua, et al., Carbon nanofiber paper for lightning strike protection of composite materials, Composites: Part B 41 (2010) 192-198.

(Continued)

*Primary Examiner* — Danny Nguyen
(74) *Attorney, Agent, or Firm* — Todd W. Galinski (57) ABSTRACT

A protective system is provided including a material comprising a first and second surface opposite one another and a thickness, and where the first surface has a low-electrical resistance and the second surface has a high-electrical resistance that is higher than the electrical resistance of the low-electrical resistance surface, and the material conducts charge from the first surface to the second surface through the thickness. This can be provided in a bilayer structure where a first protective layer having a low-resistivity is disposed upon a second protective layer having a high-resistivity. This protective system is particularly useful for dissipating electrical charge, for example as a lightning strike protection system for composite aircraft.

16 Claims, 8 Drawing Sheets

(a)    (b)

(56) References Cited

U.S. PATENT DOCUMENTS

| | | | |
|---|---|---|---|
| 6,995,954 B1 * | 2/2006 | Coon ........................ | 360/245.9 |
| 7,277,266 B1 | 10/2007 | Le et al. | |
| 7,307,825 B2 | 12/2007 | De La Fuente De Ana et al. | |
| 8,178,606 B2 | 5/2012 | Sang et al. | |
| 2006/0292375 A1 | 12/2006 | Martin | |
| 2007/0141927 A1 | 6/2007 | Brown | |
| 2008/0144249 A1 | 6/2008 | Rawlings | |
| 2009/0227162 A1 | 9/2009 | Kruckenberg et al. | |
| 2011/0014356 A1 | 1/2011 | Fornes et al. | |
| 2011/0159764 A1 | 6/2011 | Price et al. | |
| 2011/0174522 A1 | 7/2011 | Simmons et al. | |
| 2011/0259999 A1 | 10/2011 | Therond et al. | |
| 2011/0318981 A1 | 12/2011 | Duval et al. | |
| 2012/0063050 A1 * | 3/2012 | Langone et al. .............. | 361/117 |
| 2012/0138609 A1 | 6/2012 | Gerken et al. | |
| 2012/0145319 A1 | 6/2012 | Schaaf et al. | |

FOREIGN PATENT DOCUMENTS

| | | |
|---|---|---|
| EP | 2 399 739 | 12/2011 |
| JP | 2006-219078 | 8/2006 |
| WO | 2007/127032 | 11/2007 |
| WO | 2008/018421 | 2/2008 |
| WO | 2008/056123 | 5/2008 |
| WO | 2009/118509 | 10/2009 |
| WO | 2009/128991 | 10/2009 |
| WO | 2010/069944 | 6/2010 |
| WO | 2010/095536 | 8/2010 |
| WO | 2013/041712 | 3/2013 |

OTHER PUBLICATIONS

European Patent Office, PCT International Search Report and Written Opinion for International Application No. PCT/US2012/052004, dated May 2, 2013.

* cited by examiner

LIGHTNING STRIKE PROTECTION SYSTEM

CROSS REFERENCE TO RELATED APPLICATIONS

The present application claims priority under 35 U.S.C. §119(e) from U.S. Provisional Patent Application Ser. No. 61/527,146 entitled "BILAYER LAMINATE FOR LIGHTNING STRIKE PROTECTION", filed Aug. 25, 2011, the disclosure of which is herein incorporated by reference.

FIELD OF THE INVENTION

The invention relates to composite laminates, and in particular to composite laminates comprising a structural layer and one or more non-structural layers provided thereon to protect the structural layer.

BACKGROUND OF THE INVENTION

Owing to excellent combinations of strength and weight, composite materials are being increasingly used to replace aluminum in aircraft structures. Although this affords significantly increased fuel efficiency and/or greater payload capacity, aircraft structures unfortunately become more vulnerable to lightning damage. This increased vulnerability is rooted in the inferior electrical conductivity of composites, such as those based on carbon fiber reinforced materials, relative to that of aluminum metal. Naturally, the less conductive a material is the more energy that it will absorb owing resistive heating mechanisms. It has been reported that carbon fiber composites can absorb nearly 2,000 times the amount of energy from lightning strikes as compared to the same mass of aluminum. The increased absorbed energy leads to increased "direct" and "indirect" effects.

Direct effects are associated with physical or "direct" damage to load bearing structures, with the worst types of damage being severe punctures through composites laminates. "Indirect" effects are associated with electrical surges caused by the lightning's massive electromagnetic field. These surges can disrupt avionics and in turn compromise the pilot's ability to control the aircraft. Indirect effects are even more of concern lately as aircraft controls are increasingly moving towards fly-by-wire systems. It is for this reason why massive amounts of electromagnetic interference (EMI) shielding materials in the form of boxes, gaskets, metal foils and meshes, adhesives, metal sheathing, etc. are used to shield electrical components, wiring, and connections.

In order to protect composites against the aforementioned effects, aircraft designers seek to keep the strong electrical currents on the outer surface of the aircraft by integrating highly, conductive skins in the composite structure. Numerous attempts to produce such lightning strike protection (LSP) skins have been made and/or proposed, each with varying degrees of success. For example, metal wire meshes and expanded metal foils (EMF) based on metals such as copper, aluminum, or bronze have been embedded in a surfacing (or adhesive) films and co-cured with underlying composite prepregs. Alternatively, individual wires have been interwoven with carbon fibers to produce hybrid prepregs. Similarly, metal deposition techniques have been employed to coat carbon-fibers or other reinforcing fibers in their raw or woven forms. In addition to metalized fibers, flame spray is another LSP approached used, which involves depositing molten metal, typically aluminum, onto substrates.

Recently, conductive films and adhesives have been promoted which provide lightning strike protection while reducing weight, cost, and facilitating easier installation and repair. These materials are discussed in U.S. Patent Application Publication No. 2011/0014356.

All of the aforementioned LSP systems attempt to maximize protection of the substrate while minimizing weight and cost.

SUMMARY OF THE INVENTION

In a first aspect of the present invention a protective system is provided comprising a material comprising a first and second surface opposite one another and a thickness, wherein the first surface comprises a low-electrical resistance and the second surface comprises a high-electrical resistance that is higher than the electrical resistance of the low-electrical resistance surface, and the material conducts charge from the first surface to the second surface through the thickness.

In one embodiment of the present invention, the material comprises a Z-axis resistance for a 1 $cm^2$ area of between $1\times10^{-6}$ Ohms-cm and $1\times10^4$ Ohms-cm when the material comprises a thickness of between 10 and 100 microns. In another embodiment of the present invention, the material has a resistance in the Z-axis that varies as a gradient from the first surface to the second surface.

In a further embodiment of the present invention, the material comprises a first protective layer comprising a low-resistivity layer disposed upon a second protective layer comprising a high-resistivity layer, wherein the electrical resistivity of the low-resistivity layer is less than the electrical resistivity of the high-resistivity layer. In another embodiment of the present invention, the protective system further comprises at least one additional layer disposed between the first protective layer and the second protective layer and having a resistivity greater than that of the low-resistivity layer and less than that of the high-resistivity layer.

In an additional embodiment of the present invention, at least one of the first layer and the second layer comprises a polymer filed with electrically conductive particles, and preferably wherein at least one of the first layer and the second layer comprises a self-assembled heterogeneous composite. In a still further embodiment of the present invention, at least one of the first layer and the second layer does not comprise a self-assembled heterogeneous composite.

In a preferred embodiment of the present invention, the first protective layer has an electrical resistivity of no more than $1\times10^{-3}$ Ohm-cm, and the second protective layer has an electrical resistivity of at least $1\times10^{-3}$ Ohm-cm. In another embodiment of the present invention, the second protective layer has an electrical resistivity of between $1\times10^{-3}$ Ohm-cm and $1\times10^6$ Ohm-cm, and more preferably the second protective layer has an electrical resistivity of between $1\times10^{-3}$ Ohm-cm and $1\times10^4$ Ohm-cm. In an additional embodiment of the present invention, the ratio of the resistivity of the low-resistivity layer to the resistivity of the high-resistivity layer is at least 10, preferably at least 100.

In another embodiment of the present invention, the protective system further comprises a supportive medium in at least one of the first layer, the second layer, or disposed therebetween. Additionally, in another embodiment of the present invention, the first layer has a Z-axis thickness that is different than a Z-axis thickness of the second layer.

In a further aspect of the present invention, a composite is provided comprising a protective system comprising a first surface having low-resistivity and a second surface having a high-resistivity, wherein the protective system is disposed upon a structural layer such that the second surface is disposed along and in contact with the structural layer. In one embodiment of the present invention, the protective system comprises a first protective layer comprising a low-resistivity layer disposed upon a second protective layer comprising a high-resistivity layer, wherein the electrical resistivity of the low-resistivity layer is less than the electrical resistivity of the high-resistivity layer.

In one embodiment of the present invention, the structural layer comprises at least one layer of carbon fiber impregnated with a resin. In another embodiment of the present invention, the structural layer comprises at least one of a glass fiber material, a thermoplastic material, a thermoset material and a ceramic material.

In a further embodiment of the present invention, the protective system provides lightning strike protection to the structural layer, and in a further embodiment the structural layer comprises 6 layers of carbon fiber impregnated with a resin and the protective system is capable of dissipating the energy from at least a Zone 1A lightning strike such that no damage is apparent on the side of the carbon fiber opposite the protective system.

In an additional embodiment of the present invention, the amount of electromagnetic energy able to pass through to and impinge upon the structural layer is reduced by at least 50 percent while said energy is passing through the protective system as compared to the amount of electromagnetic energy impinging on the structural layer without the aid of the protective system. And in a still further embodiment of the present invention, the composite further comprises at least one paint layer disposed upon the low-resistivity layer.

In an additional aspect of the present invention, a method for assembling a composite material is provided comprising (a) providing a substrate, and (b) mating a high-resistivity layer and a low-resistivity layer with the substrate such that the high-resistivity layer is in contact with the substrate to form a composite material. In one embodiment of the present invention, the substrate comprises a carbon fiber prepeg.

In another embodiment of the present invention, the high-resistivity layer is sprayed upon the substrate, while in a further embodiment the low-resistivity layer is sprayed upon the high-resistivity layer. In a still further embodiment of the present invention, the low-resistivity layer and high-resistivity layer are pre-formed as a single film which is then mated with the substrate. In another embodiment the pre-formed single film is pre-baked and b-staged prior to being mated with the substrate. In still another embodiment the pre-formed single film is assembled by spraying the low-resistivity layer on a surfacing film, then spraying the high-resistivity layer on the low-resistivity layer.

In an additional embodiment of the present invention, the method further comprises the step (c) of curing the composite material. In an alternate embodiment of the present invention, the substrate is provided pre-cured and the low-resistivity layer and high resistivity layer are cured after being disposed on the pre-cured substrate.

In a further embodiment of the present invention, the high-resistivity layer serves as a barrier layer to prevent contact between the low-resistivity layer and the substrate. In yet another embodiment of the present invention, the pre-formed film is disposed in a mold, then the substrate material is added to the mold as a porous substrate, then a resin is introduced into the mold to fill the porous substrate and bond the substrate to the pre-formed film.

As will be realized by those of skill in the art, many different embodiments of a lightning strike protection system according to the present invention are possible. Additional uses, objects, advantages, and novel features of the invention are set forth in the detailed description that follows and will become more apparent to those skilled in the art upon examination of the following or by practice of the invention.

Thus, there has been outlined, rather broadly, the more important features of the invention in order that the detailed description that follows may be better understood and in order that the present contribution to the art may be better appreciated. There are, obviously, additional features of the invention that will be described hereinafter and which will form the subject matter of the claims appended hereto. In this respect, before explaining several embodiments of the invention in detail, it is to be understood that the invention is not limited in its application to the details and construction and to the arrangement of the components set forth in the following description or illustrated in the drawings. The invention is capable of other embodiments and of being practiced and carried out in various ways.

It is also to be understood that the phraseology and terminology herein are for the purposes of description and should not be regarded as limiting in any respect. Those skilled in the art will appreciate the concepts upon which this disclosure is based and that it may readily be utilized as the basis for designating other structures, methods and systems for carrying out the several purposes of this development. It is important that the claims be regarded as including such equivalent constructions insofar as they do not depart from the spirit and scope of the present invention.

So that the manner in which the above-recited features, advantages and objects of the invention, as well as others which will become more apparent, are obtained and can be understood in detail, a more particular description of the invention briefly summarized above may be had by reference to the embodiment thereof which is illustrated in the appended drawings, which drawings form a part of the specification and wherein like characters of reference designate like parts throughout the several views. It is to be noted, however, that the appended drawings illustrate only preferred and alternative embodiments of the invention and are, therefore, not to be considered limiting of its scope, as the invention may admit to additional equally effective embodiments.

DETAILED DESCRIPTION OF THE INVENTION

In a first embodiment of the present invention, a protective system is provided comprising a material comprising a first and a second surface opposite one another and a thickness, wherein the first surface comprises a low-resistance and the second surface comprises a high resistance that is higher than the resistance of the low-resistance surface, and the material conducts electrical charge from the first surface to the second surface through the thickness. In one embodiment of the present invention, the material has a variable resistance in the Z-axis that varies as a gradient from the first surface to the second surface.

In another embodiment of the present invention, a protective system is provided comprising a low-resistivity layer disposed upon a high-resistivity layer, such that the electrical resistance of the low-resistivity layer is less than the electrical resistance of the high-resistivity layer.

Potential applications for such a system include protection against lightning strikes, electromagnetic interference, electrostatic charge buildup, or electromagnetic pulses for various surfaces and substrates. As compared to prior art systems, the systems of various embodiment of the present invention are capable of providing substantially improved protection of carbon-reinforced substrates, even when painted. Moreover, the systems of the present invention afford significantly reduced weight and cost savings due to reduced precious metal content.

For the purposes of this description, electrical sheet resistance describes the opposition to the passage of an electric current through a material, and in particular the sheet resistance as measured at the surface of a material, and is generally expressed with the unit Ohms/square. Throughout this description, the electrical resistance on the resulting panels was measured using a Keithley 580 Micro-Ohmmeter equipped with a collinear 4 point probe. Electrical resistivity (also known as resistivity or volume resistivity) of a material does not depend on the size or shape of the material, and allows direct comparison of materials on an equal basis, and is generally expressed with the units of Ohm-cm. Resistivity is related to resistance through the equation $\rho=(A/L)*R$, where $\rho$ is the volume resistivity, A is the cross-sectional area, L is the length and R is the resistance. A low resistivity indicates a material that readily allows the movement of electric charge.

Thus, for the purposes of the present invention, the protective system is more accurately described in terms of resistivity when discussing the various layers so as to not be dependent upon the thickness of the layer. However, when discussing specific materials or general concepts relating to the various layers sheet resistance may be used.

Referring to the Figures, FIG. 1(a) illustrates a monolayer lighting strike protective coating 10 of the prior art, such as that described in U.S. Patent Application Publication No. 2011/0014356. FIG. 1(b) illustrates a bilayer system of an embodiment of the present invention comprising a low-resistivity layer 12 disposed on a high-resistivity layer 14. In this manner, an electrical charge such as that from a lightning strike will be conducted relatively easily through and along the low-resistivity layer 12, with a smaller proportion of the charge migrating through and dissipating through the high-resistivity layer 14.

FIG. 1(c) illustrates an embodiment of the present invention comprising a low-resistivity layer 12 disposed upon a high-resistivity layer 16. When employed as a lightning strike protectant system, or other means for dissipating an electrical charge, it is believed that allowing some charge to dissipate from the low-resistivity layer 12, through the high-resistivity layer 16 to an underlying substrate helps to more quickly dissipate the charge thereby presenting a buildup of charge which can lead to catastrophic failure of the system and substrate. This is a particular advantage when the underlying substrate is slightly conductive, such as a carbon prepreg.

FIG. 1(d) illustrates another embodiment of the present invention, where in a low-resistivity layer 12 is disposed upon a high-resistivity layer 18 where the high-resistivity layer has conductivity in a Z-axis provided by an appropriate filler 20 which provides an electrical pathway through the layer 18. This high-resistivity layer 18 optionally comprises no conductivity in the planar, X- and Y-axes, directions. For certain applications, conductivity in the x- and y-axes does not appear to enhance the overall protective capabilities of the system. As discussed above, allowing some charge to dissipate through the Z-axis from the low-resistivity layer through the high-resistivity layer to the substrate appears to provide the bulk of the increased effectiveness seen in systems of the present invention.

Figure 2:
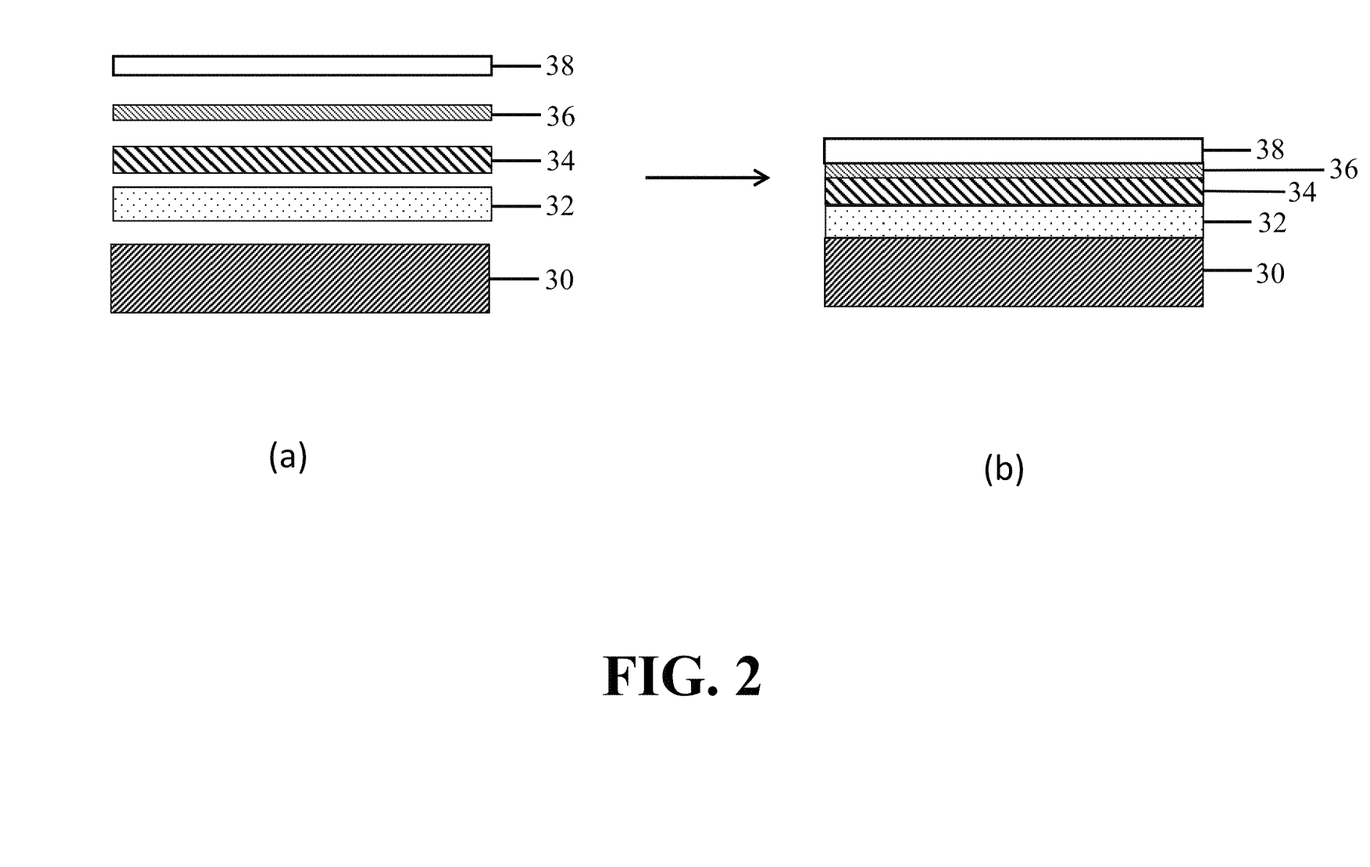
FIG. 2 is a multilayer composite structure according to an embodiment of the present invention.

FIG. 2 illustrates the protective system in an embodiment of the present invention incorporated into a typical aircraft composite section. FIG. 2(a) illustrates an exploded view of a substrate 30, a high-resistivity layer 32 adjacent to the substrate, a low-resistivity layer 34 upon the high-resistivity-layer 32, a primer 36 upon the low-resistivity layer 34, and a paint layer 38 atop the primer 36. After forming the various layers, the system as complete is illustrated in FIG. 2(b). While there are several methods for forming the composite of FIG. 2, commonly the layers 34 and 32 are formed on a release film, typically by spraying or casting a film, and then the layers are mated to the substrate 30. Typically, when an autoclave is employed, the formed layers are placed in an autoclave such that the high-resistivity layer 32 is facing outward, then the substrate 30 is placed in the autoclave such that the substrate 30 is disposed adjacent to the high-resistivity layer 32. Then all three components 30, 32, and 34 are autoclaved to cure and bond them together into a bonded assembly. The bonded assembly is then painted with a primer layer 26, and finally a paint layer 38. Further methods of assembly may be material dependant and are discussed in more detail below.

In a preferred embodiment of the present invention, at least a portion of the protective system comprises a resinous material comprising a heterogeneous resin/filler technology, such as that described in U.S. Patent Application Publication No. 2011/0014356, herein incorporated by reference.

In a first embodiment of the present invention, the material employed in the protective system comprises a curable material filled with conductive filler capable of self-assembling to form conductive pathways during a cure process. The conductive filler self-assembles into conductive pathways during cure of the polymer matrix to provide a conductive material having a lower electrical resistance than a similarly filled homogenous system.

The mechanism of self-assembly and structure formation is achieved through the proper selection of component materials and adherence to particular processing conditions. In one embodiment of the present invention, the filler component comprises a conductive filler (thermal, electrical or both) and the organic compound comprises a monomer and optionally a curative agent. The formation of filler rich domains during reaction of the organic material allows for direct filler-to-filler particle contacts to be made. In the presence of heat the particles may further sinter together. Sintering eliminates the contact resistance between the previously, non-sintered filler particles thereby substantially improving the thermal and/or electrically conductivity of the composite.

While not fully understood and not wishing to be bound by this theory, it is believed that the self-assembly and domain formation and sintering are sensitive, to the organic material's cure temperature, the cure time, and the level of pressure applied during the cure. In other words, domain formation and sintering are thermodynamically driven processes. In a still a further embodiment, the temperature profile at which the sample is heated will affect the extent of domain formation and sintering. In total, the processing conditions can be tailored to achieve a conductive adhesive having the best combination of properties at minimal filler loading, which often translates to lower cost and provides an opportunity to take advantage other properties that are adversely affected by high filler loadings, in some cases, when the material is employed in an application that is not able to withstand high sintering temperatures, higher pressures or non-traditional sintering techniques may used to achieve exceptionally low-resistance.

The filler component and reactive organic compounds are chosen so as to create a homogeneous mixture when mixed. However, during the cure, it is believed that the resulting polymer formed from the organic compound then has a repulsive interaction with the filler so as to allow the composition to self-assemble into a heterogeneous compound having filler-rich domains wherein the filler composition is significantly, higher than the bulk filler concentration. Thus, while the overall (bulk) filler concentration of the compound does not change, the filler particles and the organic component self-assemble in situ into respective regions of high concentration. This phenomenon can lead to a self-assembled network of interconnected filler particles formed in situ from a mixture having very few, if any, initial filler-filler contacts.

There are several approaches which may be employed to create the repulsive interaction between the filler component and the organic compound. However, in a preferred embodiment of the present invention, this is achieved by coating a filler particle with a non-polar coating and mixing the coated filler in a reactive organic compound comprising a relatively nonpolar resin and a polar curing agent. In an uncured state, the resin, curative, and filler form a relatively homogeneous mixture in which the coated filler and the resin are compatible with one another and form a relatively homogeneous mixture. However, with the application of heat the curing agent reacts with the resin forming a polymer having polar moieties thereon, resulting in a repulsive interaction between the non-polar coating on the filler and the polar moieties on the polymer. This repulsive interaction leads to the self-assembling of polymer-rich and filler-rich domains whose respective concentrations are significantly higher than the bulk concentrations of polymer and filler, respectively. Moreover, extensive domain formation is capable of creating continuous filler-rich domains with substantial particle to particle contact between most of the filler particles.

Other types of interactions capable of creating repulsive effects upon curing of the organic compound in the presence of the filler, could consist of, but are not limited to, electrostatic interactions, hydrogen bonding interactions, dipole-dipole interactions, induced dipole interaction, hydrophobic-hydrophilic interactions, van der Waals, interactions, and metallic interactions (as with an organometalic compound and metallic filler). Other forms of repulsive interactions could arise from entropic related effects such as molecular weight differences in the polymers formed from the organic compound(s). Additionally, repulsive interactions could arise as a result of an external stimulus such as electrical field.

The domains formed upon curing of the organic compound in the presence of the filler results in filler-rich domains having a higher than bulk (average) filler concentrations and in organic rich domains having lower than bulk (average) filler concentrations. The areas of higher than average filler concentration can form semi-continuous or continuous pathways of conductive filler material extending throughout the body of the cured composition. These pathways provide a low resistance route through which electrons and/or thermal phonons can travel. In other words, the pathways or channels allow for greatly enhanced thermal or electrical conductivity. This conductive pathway may be further enhanced by sintering the filler particles together. Such highly conductive pathways are particularly beneficial for applications such as lightning strike protection given the large amount of electrical current and heat that must be dissipated during a strike event.

Sintering, as it is understood in the art, is a surface melting phenomenon in which particles are fused together at temperatures below the material's bulk melting temperature. This behavior is brought about by a tendency of the material to relax into a lower energy state. As such, selection of filler type, size, and shape can greatly affect the sinterability of the filler particles. Certain particles, such as thin, wide, flat, plates are often formed by shearing large particles via various milling processes. This process imparts a large amount of internal stress in addition to creating a large amount of surface area. When a certain amount of heat is added to the particles, they will have the tendency melt and fuse together thereby relieving the internal strain and decreasing the overall surface energy of the particles. For this reason, the preferred filler particles for use in the present invention are those that comprise some degree of thermal or electrical conductivity and sinter easily. In a still further embodiment of the present invention, the preferred filler comprises a metallic particle that has been subjected to cold working which has imparted strain into the structure of the filler which further enables sintering.

The sintering temperature will vary according to the material chosen as the filler, as well as the geometry of the filler particle. However, in a preferred embodiment of the present invention, it is advantageous to balance the cure of the organic compound and the sintering of the filler such that they occur simultaneously. In this embodiment, the cure temperature and profile is selected to coincide with the sintering temperature of the filler, so as the organic compound becomes repulsive to the filler and the filler particles are forced together, the individual filler particles can sinter once particle to particle contact is made. This is believed to be responsible for the continuous filler structure seen throughout the fully cured composition. In a preferred embodiment of the present invention, the sintering temperature is at least about 50° C., more preferably about 100° C., and even more preferably above 100° C. for silver flake filler.

In embodiments of the present invention, the self-assembling composition may be cured without the addition of heat. However, in a preferred embodiment of the present invention, the composition is cured via application of heat to the composition. Heat curing is commonly accomplished in a cure oven such as a convection oven or an autoclave, whereby hot air or radiated heat is used to increase the temperature of the composition. In alternate embodiments of the present invention, other methods of cure may be employed such as induction curing in an electromagnetic field, microwave curing, infrared curing, electron beam curing, ultraviolet curing, and curing by visible light. Additionally, the cure reaction may be self accelerated through the use of an exothermic cure reaction. A non-thermal cure may be desirable, for example, when the composition is coated on a temperature sensitive substrate such as a low Tg thermoplastic.

In another embodiment of the present invention, a low-temperature cure may be desirable. For example, the curable composition may be applied to a heat sensitive substrate or a substrate which is too large to fit into an oven or autoclave, such as spray applying the material onto an aircraft wing. In these embodiments, the cure agent and cure mechanism may be tailored to achieve a cured, self-assembled material at temperatures below 50° C., and alternately below room temperature (20-25° C.). In embodiments of the present invention where sintering does not take place during a cure step, for example in a low-temperature cure environment, the particles may initially form self-assembled pathways that are not sintered. A sintering step may then be later added. This later-added sintering step may comprise healing of the self-assembled material, either through ambient heating, or electrically induced heating such as through a lightning strike.

In one embodiment of the present invention the filler comprises inorganic fillers. Available fillers include pure metals such as aluminum, iron, cobalt, nickel, copper, zinc, palladium, silver, cadmium, indium, tin, antimony, platinum, gold, titanium, lead, and tungsten, metal oxides and ceramics such as aluminum oxide, aluminum nitride, silicon nitride, boron nitride, silicon carbide, zinc oxide. Carbon containing fillers could consist of graphite, graphene, carbon black, carbon nanotubes, and carbon fibers. Suitable fillers additionally comprise alloys and combinations of the aforementioned fillers. Additional fillers include inorganic oxide powders such as fused silica powder, alumina and titanium oxides, and nitrates of aluminum, titanium, silicon, and tungsten. The particulate materials include versions having particle dimensions in the range of a few nanometers to tens of microns.

In an embodiment of the present invention, the filler is present at about 40 volume percent or less, based on the total volume of the cured composition. In a more preferred embodiment of the present invention, the filler is present at about 30 volume percent or less, based on the total volume of the cured composition. In a most preferred embodiment of the present invention, the filler is present at about 15 volume percent or less, based on the total volume of the cured composition. The precise amount of filler will generally be determined by the desired application and whether the material is to be employed as the low-resistance layer or the high-resistance layer, as well as the conductivity (resistivity) of the filler itself.

In a preferred embodiment of the present invention, the filler comprises a material that is either electrically conductive, thermally conductive, or both. Although metals and metal alloys are preferred for use in several embodiments of the present invention, the filler may comprise a conductive sinterable non-metallic material. In an alternate embodiment of the present invention the filler may comprise a hybrid particle wherein one type of filer, for example a non-conductive filler, is coated with a conductive, sinterable material, such as silver. In this manner, the overall amount of silver used may be reduced while maintaining the sinterability of the filler particles and conductivity of the sintered material.

In an embodiment of the present invention, the filler component must be able to interact with the organic compound to impart a heterogeneous structure in the finished material. In a preferred embodiment of the present invention as discussed above, this is accomplished through the interaction of a polar organic compound with a non-polar filler. For preferred filler materials, such as metals, the filler is coated with a material comprising the desired degree of polarity. In one preferred embodiment of the present invention, the filler coating comprises a non-polar fatty acid coating, such as stearic, oleic, linoleic, and palmitic acids. In a still further embodiment of the present invention, the filler coating comprises at least one of several non-polar materials, such as an alkane, paraffin, saturated or unsaturated fatty acid, alkene, fatty esters, waxy coatings, or oligomers and copolymers. In additional embodiments of the present invention, non-polar coatings comprise ogranotitanates with hydrophobic tails or silicon based coatings such as silanes containing hydrophobic tails or functional silicones.

In a further embodiment of the present invention, the coating or surfactant, coupling agent, surface modifier, etc.) is applied to the filler particle prior to the particles' incorporation into the curable composition. Examples of coating methods are, but not limited to, deposition from an aqueous solution, bulk deposition onto raw filler (e.g. using a spray solution and cone mixer, mixing the coating and filler in a mill or Attritor), and vapor deposition. In yet a further embodiment, the coating is added to the composition as to treat the filler prior to the reaction between the organic components (namely the resin and curative).

In an alternate embodiment of the present invention, the polarity of the filler/coating and polymer are reversed wherein the filler/coating comprises a polar moiety and the organic compound comprises a non-polar polymer. Similarly, in an embodiment of the present invention, in which a repulsive effect other than polarity is employed to drive the self-assembly, the active properties of the filler and organic components may be interchanged.

In a preferred embodiment of the present invention the organic compound comprises an epoxy resin and a cure agent. In this embodiment, the organic compound comprises from about 60 to about 100 volume percent of the total composition. In this embodiment, the organic compound comprises approximately from 70 to 85 percent by weight of a diglycidal ether of a bisphenol compound, such as bisphenol F, and 15 to 30 percent by weight of a cure agent, such as a polyamine anhydride adduct based on reaction between phthalic anhydride and diethylenetriamine.

In additional embodiments of the present invention, suitable organic compounds comprise monomers, reactive oligomers, or reactive polymers of the following type siloxanes, phenolics, novolac, acrylates (or acrylics), urethanes, ureas, imides, vinyl esters, polyesters, maleimide resins, cyanate esters, polyimides, polyureas, cyanoacrylates, benzoxazines, unsaturated diene polymers, and combinations thereof. The cure chemistry would be dependent on the polymer or resin utilized in the organic compound. For example, a siloxane matrix can comprise an additional reaction curable matrix, a condensation reaction curable matrix, a peroxide reaction curable matrix, or a combination thereof. Selection of the cure agent is dependent upon the selection of filler component and processing conditions as outlined herein to provide the desired self-assembly of filler particles into conductive pathways.

Furthermore, the uncured (A-staged or B-staged, but not C-staged) self-assembling composition has desirable handling properties and is easily adaptable to various application forms. In one embodiment of the present invention, the self-assembling composition comprises a flowable adhesive (e.g. liquid or paste) that is capable of bonding to a reactive or non-reactive substrate during the cure of organic compound. Thus, the self-assembled composition comprises adhesive qualities which enhances certain application techniques and allows for stronger mechanical connections to substrates which in turn enhances the electrical connections between the substrate and the conductive network within the adhesive.

In a further embodiment of the present invention, the self-assembling composition is provided as a two-part system wherein the curable organic component is present in an "A-side" and the cure agent is present in a "B-side", such that when mixed, the cure reaction is begun. The filler and any other optional components may reside in either the A-side, B-side or both.

In another embodiment the composition is the form of a B-staged film adhesive that is commonly used in composite applications. Furthermore, the film adhesive has optional carrier fabric, such as a non-woven veil to enhance handling properties. In yet another embodiment, the veil may be electrically conductive to further enhance the conductivity of the material.

In another embodiment of the present invention, the composition can be applied as a spray to a substrate by addition of a solvent to the composition. In a preferred embodiment of the present invention, the solvent comprises a structure suitable for dissolving (in full or in part) the organic compound while capable of being evaporated under common processing conditions for composite structures. In a preferred embodiment of the present invention, wherein an epoxy resin is employed, the solvent comprises, but is not limited to, acetone, methylethylketone, toluene, xylene, benzyl alcohol, butyl acetate, cyclohexanone, dimethoxyethane, trichloroethylene, glycol ethers, and mixtures thereof. Moreover, the choice of solvent will also be dictated by the curative used. In one preferred embodiment, it is desirable to select a chemical such as acetone that acts a solvent for the epoxy resin and a non-solvent for the polyamine anhydride adduct. In one preferred embodiment of the present invention, the solvent comprises 0.25 to 1.5 parts by weight of the non-solvent components.

In a preferred embodiment of the present invention, the low-resistance layer and the high-resistance layer both comprise the heterogeneous material herein described. However, in alternate embodiments of the present invention, one or both of the layers may comprise a different means for providing conductivity. Examples of such different means for providing conductivity include, but are not restricted to, conventional filled thermoplastic or thermoset polymers, solid metal foils, expanded metal foils, metalized fibers, metalized woven fibers, interwoven metal-carbon veils, metalized non-woven veils, electrically conductive polymers, or metal-carbon fiber co-weaves. In additional embodiments of the present invention, multiple means of providing conductivity may be employed in the same layer.

In one embodiment of the present inventor, the amount of filler employed will be dependent upon the desired resistivity of the particular layer as well as the density and shape of the filler. In a preferred embodiment of the present invention comprising at least two layers wherein both layers comprise a heterogeneous conductive material, and the conductive filler comprises a silver flake, the low-resistivity layer comprises from about 50 to about 86 weight percent conductive filler, and the high-resistivity layer comprise from about 5 to about 30 weight percent conductive filler. Of course, as one skilled in the art will recognize, the relative amounts of filler can be optimized for a given filler type and desired resistivity in any single layer.

In a preferred embodiment of the present invention, the resistivity of the low-resistivity layer comprises no more than $1\times10^{-3}$ Ohm-cm, and preferably no more than $1\times10^{-4}$ Ohm-cm, and most preferably no more than $1\times10^{-5}$ Ohm-cm. In another embodiment of the present invention, the high-resistivity layer comprises a resistivity of at least $1\times10^{-3}$ Ohm-cm and preferably at least $1\times10^{-2}$ Ohm-cm. In another embodiment of the present invention, the resistivity of the high-resistivity layer preferably comprises no more than $1\times10^{6}$ Ohm-cm, preferably no more than $1\times10^{4}$ Ohm-cm, and most preferably no more than $1\times10^{2}$ Ohm-cm.

In another embodiment of the present invention, the broadest preferred ranges noted above translate into a Z-axis resistance for the high-resistivity layer for a 1 $cm^2$ surface area of from $1\times10^{-6}$ Ohms to $1\times10^{3}$ Ohms for a thickness of 10 microns, and from $1\times10^{-5}$ Ohms to $1\times10^{4}$ Ohms for a thickness of 100 microns, and the low-resistivity layer comprises a Z-axis resistance for a 1 $cm^2$ surface area of no more than $1\times10^{-6}$ Ohms for a thickness of 10 microns, and no more than $1\times10^{-5}$ Ohms for a thickness of 100 microns. Similarly, this translates into a sheet resistance of the high-resistivity layer of from 1 Ohms/square to $1\times10^{9}$ Ohms/square for a thickness of 10 microns, and from $1\times10^{-1}$ Ohms/square to $1\times10^{8}$ Ohms/square for a thickness of 100 microns, and the low-resistivity layer comprises a sheet resistance of no more than 1 Ohms/square for a thickness of 10 microns, and no more than $1\times10^{-1}$ Ohms/square for a thickness of 100 microns.

In an embodiment of the present invention employing a filled polymeric layer or layers, the invention is not process dependant and may be tailored to provide a number of different methods of manufacture. For example, the filled polymer systems may be formed via spray or film techniques, and may optionally be b-staged prior to final cure after application on a substrate. For example the protective system may be applied in b-staged form to a carbon fiber prepreg substrate, then co-curing the layers with the carbon fiber substrate. In another embodiment of the present invention, the filled polymer may be provided as a flowable adhesive, such as a liquid or paste, or spray applied directly to a substrate or surfacing film.

Preferred methods for forming the protective system of an embodiment of the present invention include those that allow the material to directly bond to a substrate thereby enhancing electrical contact between the layer and the substrate. These application techniques and allow for stronger mechanical connections to substrates which in turn enhances the electrical connections between the substrate and the conductive network within the layer. In fact, it is believed that during an autoclave procedure there is a division of material between the layers and between the layers and the substrate. In this manner, the finished product comprises interlayer boundary regions where there is a mixture of material from each adjacent layer.

The materials, systems, and methods of the embodiments of the present invention may be used to provide lightning strike protection or other electrical charge dissipation function to a variety of substrates, parts, machines, vehicles, and apparatus. In a preferred embodiment of the present invention, the methods and materials of the present invention are employed to provide protection to vehicles, including aircraft, sea, and ground vehicles, as well as structures such as antennas, radars, and wind turbines.

Although the present invention has been described with reference to particular embodiments, it should be recognized that these embodiments are merely illustrative of the principles of the present invention. Those of ordinary skill in the art will appreciate that the compositions, apparatus and methods of the present invention may be constructed and implemented in other ways and embodiments. Accordingly, the description herein should not be read as limiting the present invention, as other embodiments also fall within the scope of the present invention as defined by the appended claims.

Examples

The following three sections describe common materials, preparation procedures, and testing protocol used to evaluate different types of lightning strike films described in each of the below Examples. The data associated with these films is summarized in Table 1, and lightning strike damage for Films 1 and 6 is illustrated in FIGS. 3 and 4, and data for a Zone 1A simulated strike for all Films is plotted in FIG. 5.

Figure 6:
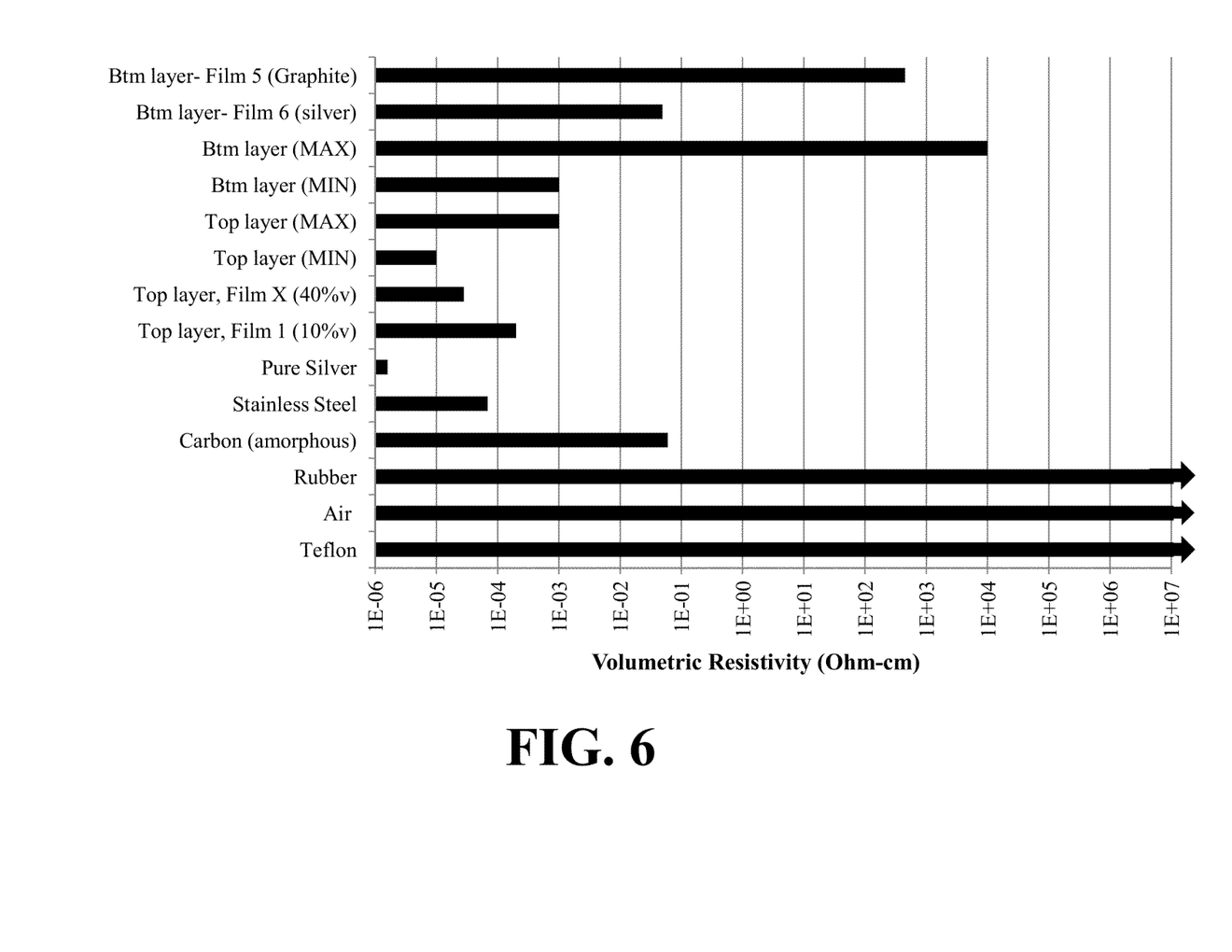
FIG. 6 is a chart showing volumetric resistivity for various materials of the prior art and the present invention.

FIG. 6 illustrates the resistivity of several high and low resistivity layers made in accordance with the present invention, the preferred minimum resistivity and maximum resistivity for one preferred embodiment of the present invention, as well as comparative resistivity of several common materials. It should be noted that the resistivity measurements for rubber, air, and Teflon are all well above the maximum of the chart as indicated by the arrows.

Film Preparation

Figure 1:
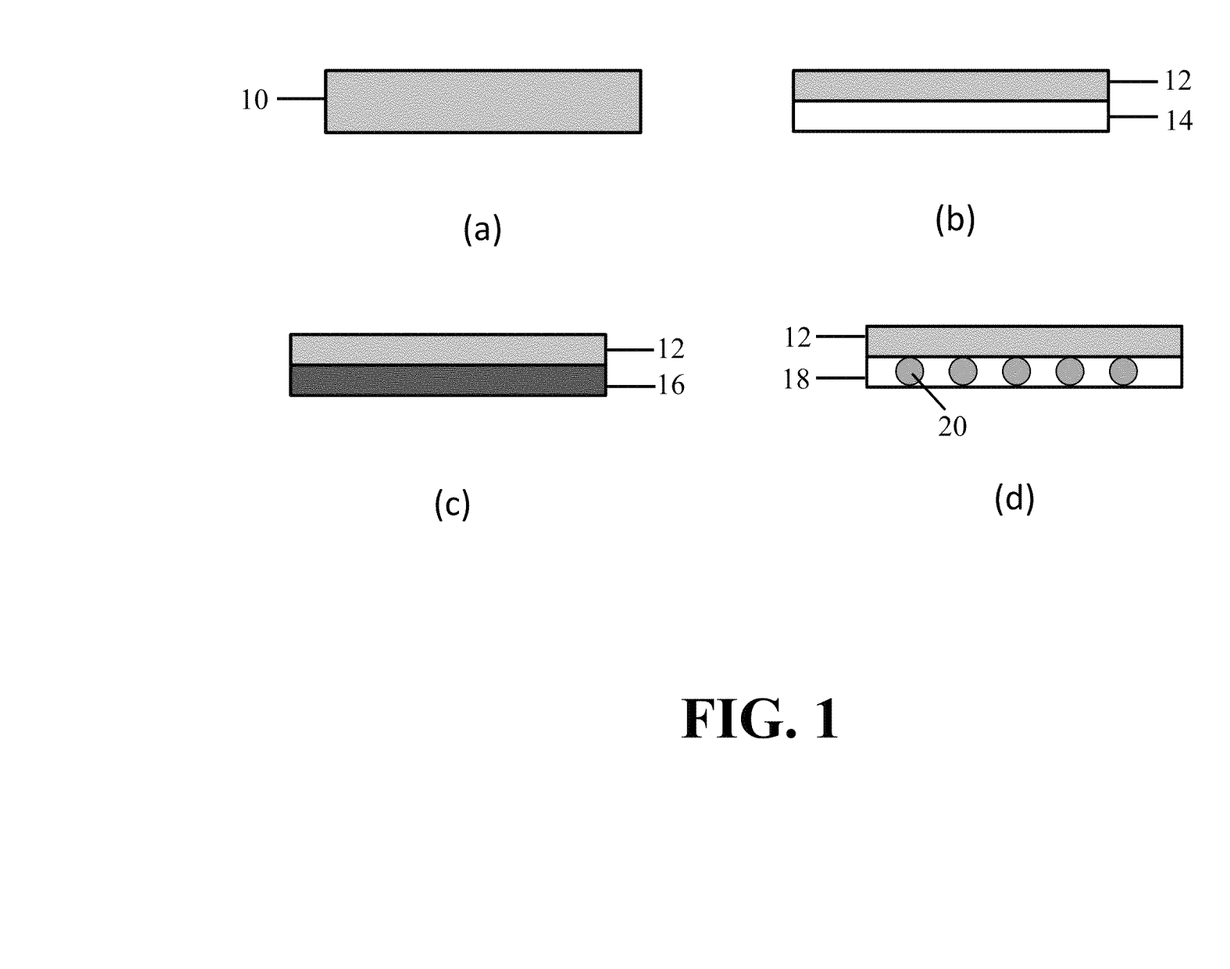
FIG. 1 is a view of various electrical protection layers with 1(a) being a single layer protective system of the prior art, and 1(b)-(d) being various bilayer protective systems according to embodiments of the present invention.

To demonstrate the viability of the bilayer concepts, monolayer and bilayer films were prepared as summarized in Table 1 and illustrated in FIG. 1. The monolayer films and the top layers of all bilayer films were based on a common formulation including a diglycidal ether of bisphenol F (DGEBF) epoxy resin, a silver flake as described in Table 1, an amine curative and various additives. This formulation has been demonstrated to generate a heterogeneous morphology during curing and is capable of protection substrates from lightning strikes as noted more fully in U.S. Patent Application Publication No. 2011/0014356. The bottom layers of the bilayer films in these Examples were prepared using this same formulation with modifications of the filler type and content only.

A total of three monolayer films (see Table 1) having an area of 61 cm×61 cm were prepared from the base formulation with 10 or 15 volume percent of a coated silver flake. The formulation ingredients were mixed using a Hauschild, dual action centrifugal mixer. To reduce the viscosity of the system and minimize excessive heating during mixing, methyl ethyl ketone (MEK) was added to the mixture to a level of approximately 15 weight percent. The resulting mixture was further diluted with MEK to achieve a final solvent concentration of approximately 45 weight percent MEK. The resulting material was further mixed in the Hauschild to achieve a uniform dispersion.

To prepare films, the mixed formulation was spray-applied on a silicone-coated, polyester release liner using a standard HVLP spray gun (~30 psi air, 1.4 mm tip diameter). Numerous passes were made to achieve the desired dried areal weight of 190 g/m$^2$ (gsm) for all films, except Film 3 whose target weight was 110 gsm. Following spraying, the resulting wet film was then placed in a preheated oven (set point=50° C.) for 30 minutes to remove any residual MEK. Next, a non-woven, polyester carrier (areal weight=12 gsm) was rolled into the film by hand. A second piece of release liner was placed over the resulting film. The assembly was then placed between two large sheets of aluminum and placed in a vacuum bag. Air was removed from the vacuum bag using a vacuum pump. The assembly was then placed in a preheated oven (set point=80° C.) for approximately 15 minutes. The film was removed from the oven and its areal weight measured.

In the case of the bilayer films (Films 4-7), the conductive top coat was first applied to the silicone coated polyester release liner first followed by the spray application of the isolating or semiconducting bottom layer. The target dried areal weight for each bilayer was 190 gsm film (110 gsm for the top layer, 68 gsm for the bottom, and 12 gsm for the polyester veil.) The remaining steps used to make the films are identical to the procedure continued as described above.

In addition to the aforementioned film work, electrical resistivity measurements were conducted on the base formulations used to make the monolayer and the bilayer films. Samples were cast onto fluorinated release film using a bird bar-style application to achieve a cured, film thickness is accord to those listed in Table 1. Films were cured in a convection oven at under the following conditions: Temp Ramp: 2.8° C./min (~56 min to peak temp), peak temp soak: 177° C. for 120 min, 60 minute cool to room temperature. The electrical sheet resistance on the resulting panels was measured per ASTM F1711 using a Keithley 580 Micro-Ohmmeter equipped with a collinear 4 point probe. The four point probe was calibrated using a NIST traceable sheet resistance standard. The volumetric resistivity (ohm-cm) of the conductive film was obtained from the sheet resistance (ohm/square) and film thickness (cm). In the case of Film 7, its high resistance required the use of 610C Keithly Electrometer equipped with a separate individual single point probes to measure its resistance.

Resistivity measurements were also made the semiconducting, lower layer of Film 7 to assess its ability to conduct charge in the normal or Z-direction. This was done using a modified version of ASTM D2739. Specifically, the semiconducting material was sprayed onto on side of a 15.2 cm by 10.2 cm sheet of 0.81 mm thick sheet of steel and b-staged as previously described. Prior to the final cure, a second sheet of steel was placed on the exposed side of the adhesive layer, thereby sandwiched the adhesive between the two steel substrates. C-clamps were applied to the substrate and the assembly was cured as previously mentioned. The through resistance of the combined assembly was measured using a Keithlye 580 MicroOhmmeter equipped using two point electrical probes that were applied to the top and bottom surface of the sandwich structure.

Lighting Strike Test Panel Preparation

The aforementioned films were ultimately co-cured on an 8-ply carbon reinforced epoxy laminate. This process involved the following general procedure: first cutting 60.9 cm×60.9 cm squares of the LSP films and 3k-70-PW carbon fiber-epoxy prepreg having a 177° C. (350° F.) cure. The LSP films were then applied to a polished, release-coated aluminum tool surface, followed by the addition of the carbon prepreg plies. The individual plies are applied at the following angles relative to each other to provide a mechanically balanced and symmetrical laminate: 90°|45°|90°|45°|| 45°|90°|45°|90°. The LSP-carbon laminate assembly was the placed in a vacuum bag assembly and allowed to de-bulk for approximately 30 minutes to help remove any air and further consolidate the laminate. Next, the assembly was cured in an autoclave under the following conditions: Temp Ramp: 1-2.75° C./min (2-5° F./min) (~56 min-120 min to peak temp), peak temp soak: 177±5.5° C. (350±10° F.), 120 min, pressure: 50 psi, cool down: max 3.3° C. (6° F./min) to 26.6° C. (80° F.) (45-60 min), air cool overnight under static vacuum.

The electrical sheet resistance on the resulting panels was measured as described in ASTM F1711 using a Keithley 580 Micro-Ohmmeter equipped with a collinear 4 point probe. The four point probe was calibrated using a NIST traceable sheet resistance standard. The volumetric resistivity (ohm-cm) of the conductive film was obtained from the sheet resistance (ohm/square) and film thickness (cm). After this step, the panels were treated with sandable surfacing primer to eliminate any surface defects. The sandable surfacing primer was followed by the addition of aerospace grade epoxy primer and urethane top-coat paint. The combined thickness of these materials was targeted at approximately 175 microns (sandable primer=50 mil, primer=25 mil, topcoat=100 mil). FIG. 2 shows a general cross-section of the lightning strike test panel per the above description.

Lighting Strike Testing

Lighting strike testing was conducted on the painted panels according to SAE ARP5412—Zone 1A and Zone 2A specifications. Note, the panels were initially struck under Zone 2A conditions followed by striking a separate portion of the panel under Zone 1A conditions. Struck panels were visually assessed for damage. The presence and size of any cracks or punctures in panels, the number of carbon plies penetrated by the lightning, extent of carbon prepreg delamination, and paint damage were noted.

Comparative Films 1-3

Figure 3A:
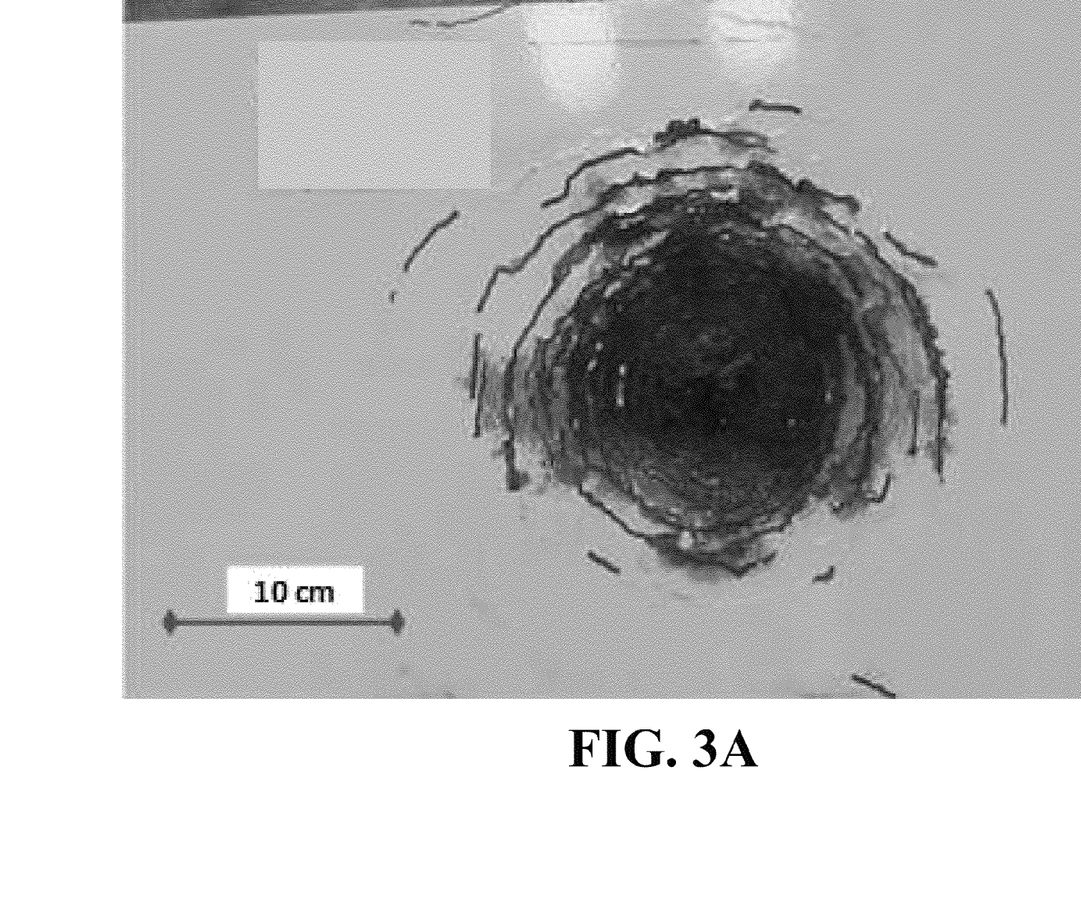
FIG. 3 is a front side (a) and rear side (b) view of a prior art protective system on a carbon fiber substrate after sustaining a lightning strike.
Figure 3B:
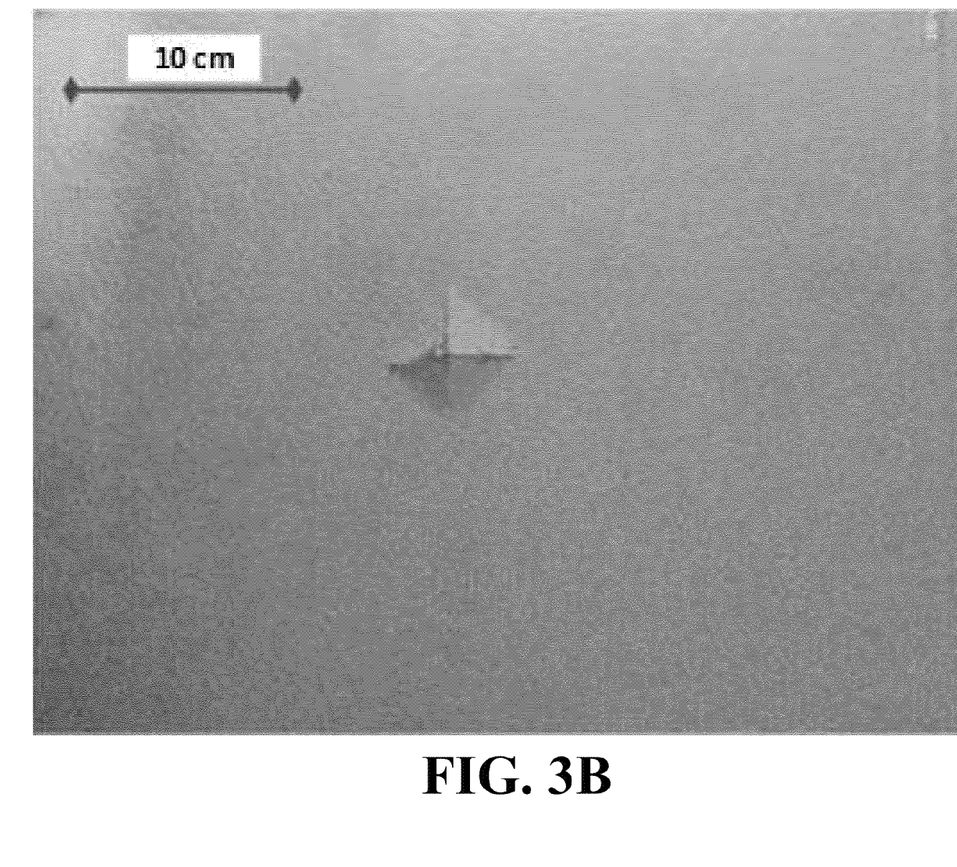
Figure 4A:
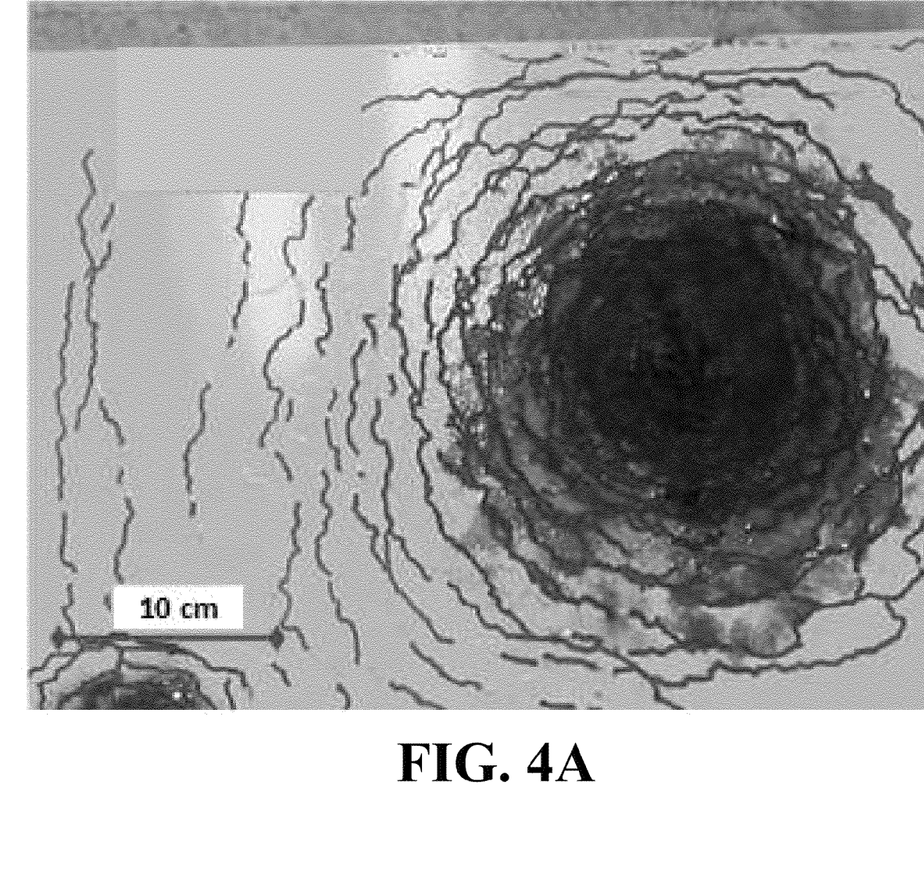
FIG. 4 is a front side (a) and rear side (b) view of a protective system of an embodiment of the present invention on a carbon fiber substrate after sustaining a lightning strike.

Three lightning strike panels were prepared from monolithic films according the aforementioned procedure. As indicated by their classification, i.e. "monolayer", each of the LSP film consists of a highly conductive, single layer originating from one formulation, as illustrated in FIG. 1(a). The three monolayer films used differ from each other in the total areal weight and/or silver content as described in Table 1. Films 1 and 2 have a nominal areal weight of 190 gsm but differ in concentration of silver used in each formulation, i.e. 10 and 15 volume percent respectively. Film 3 has a comparable silver concentration to that of Film 2; however, its areal weight is approximately 33 percent less. Film 1 exhibited a sheet resistance intermediate to that of Films 2 and 3 which is a reflection of the lower silver content used to make Film 1. The sheet resistance for Film 3 was approximately twice that of Film 2 which is primarily associated with having ~33 percent less areal weight. With regard to lightning strike performance, Film 1 was incapable of preventing penetration of the lightning through all eight plies of the panel when tested under Zone 1A and Zone 2A conditions (see Table 1). Damage to Film 1 is illustrated in FIG. 3 with the front side damage apparent in FIG. 3(a) and the rear side damage apparent in FIG. 3(b). On the other hand, only 2 and 1 carbon plies were penetrated for the LSP panel based on Film 2 when struck using Zone 1A and 2A testing conditions, respectively. Reducing the areal weight of this LSP film by ~33 percent, i.e. Film 3, however, leads to increased lightning penetration under both testing conditions. Specifically, all 8 plies were penetrated when tested under Zone 1A conditions and 3 plies were penetrated when tested under Zone 2A conditions.

Film 4

In effort to electrically isolate the lightning from the carbon substrate, a panel was prepared from an LSP film having an isolated bilayer configuration with no ability to conduct charge through the lower layer. The isolated bilayer was formed by first applying a 112 gsm, highly conductive top layer release film followed by applying 68 gsm, electrically insulating layer. (Note, the highly conductive top layer was identical in composition and had comparable area weight as that of the monolayer Film 3.) The resulting bilayer film was applied with the insulating layer adjacent to carbon substrate prior to curing the panel. Counter to Film 3, incorporating an insulating layer leads to improved protection against lightning penetration, i.e. Film 4 relative to Film 3. Notably, the number of plies penetrated the panel based on Film 4 were 7 and 2 for Zones 1A and 2A testing conditions, respectively. This improved performance was achieved despite the cured film having comparable electrical resistivity to that of Film 3 having no insulating layer. Comparison of these results to Film 1 demonstrated the ability to provide substantially better protection at considerably less total silver content.

Film 5

The film, denoted Film 5 in Table 1, was prepared in the same manner as the isolated bilayer film (Film 4) previously described in Example 2; however, the bottom layer was filled with 10 volume percent synthetic graphite powder to make this layer moderately resistive. As mentioned above the volume resistivity of the formulation when cured alone was $4.5 \times 10^2$ Ohm-cm, as seen in FIG. 6, which is approximately 6 orders of magnitude more resistive than the highly conductive top layer. Despite the film's intermediate resistivity, this semiconducting bilayer configuration resulted in an unexpectedly large improvement in lightning strike protection as shown in Table 1. Namely, the Film 5-based panel when tested under Zone 1A and 2A conditions exhibited only 2 and 1 ply penetration depths as opposed to 7 and 2 using an isolated bilayer configuration (Film 4). Moreover, the level of protection was comparable to and better than the panels based on films 1 and 2, respectively, each of which had a lower sheet resistance and considerably higher total silver concentration.

Film 6

Figure 4B:
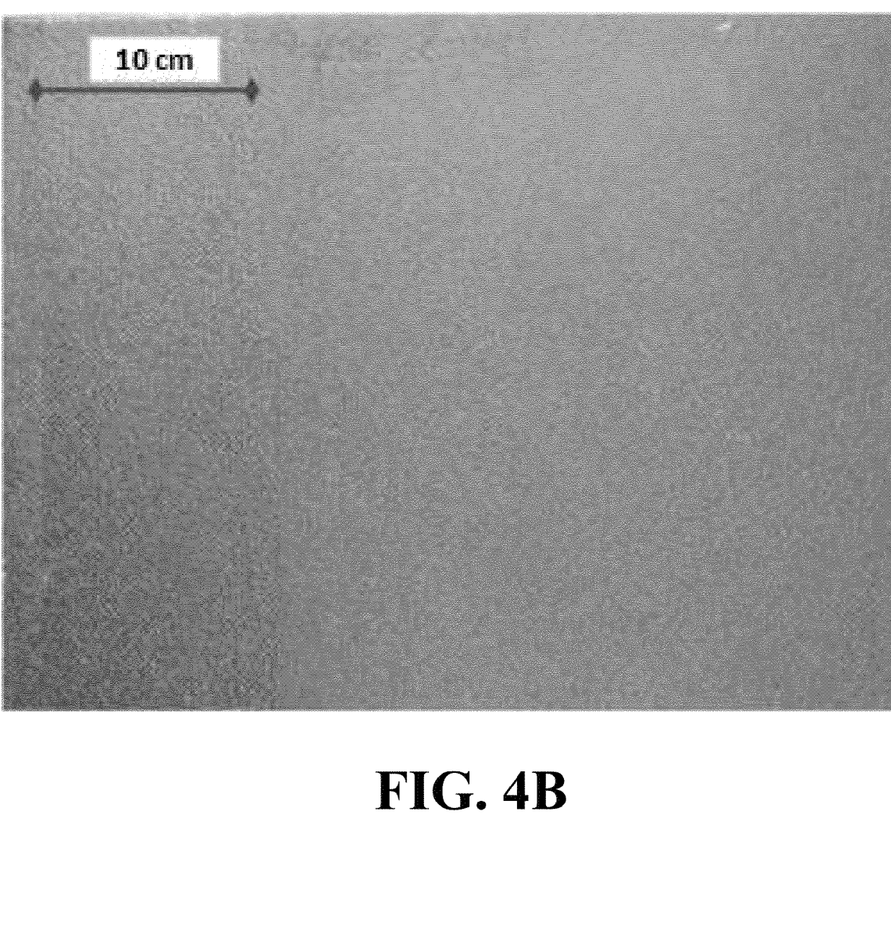
Figure 5:
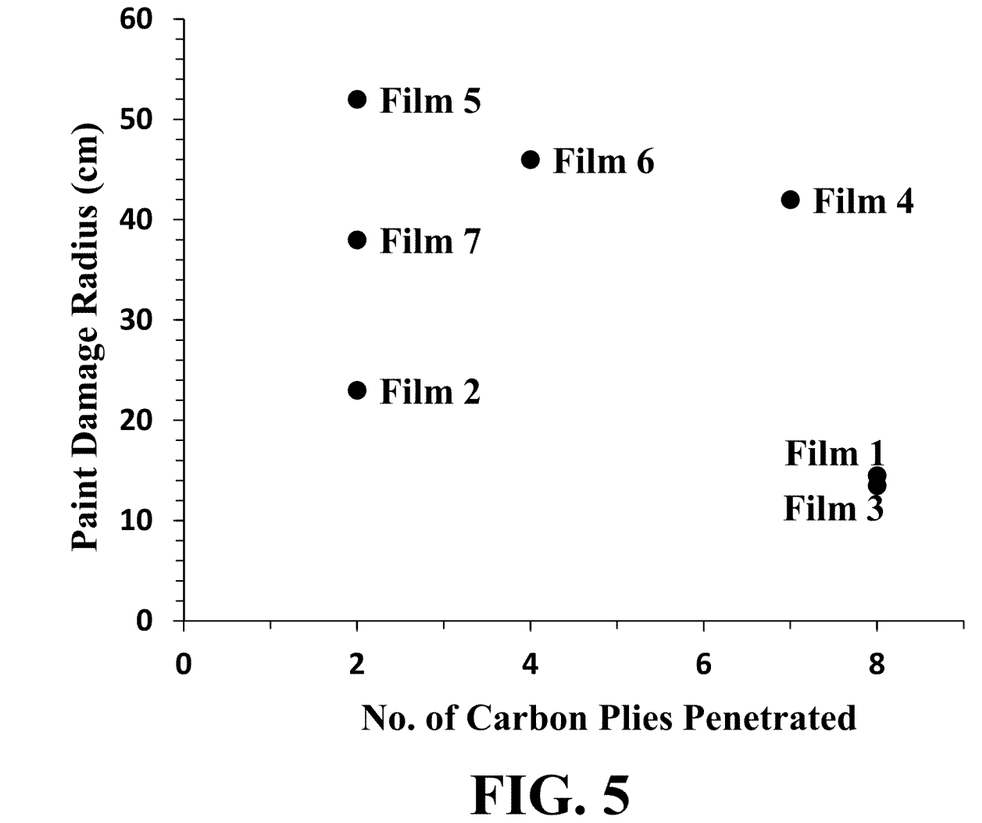
FIG. 5 is a graph of damage results of various protective systems according to the prior art and certain embodiments of the present invention.

The film, denoted Film 6 in Table 1, was prepared in the same manner as the isolated film described in Example 2; however, the bottom was filled with 2.5 volume percent silver flake to make this layer moderately resistive. As mentioned above the volume resistivity of the formulation when cured alone was $4.9 \times 10^{-2}$ Ohm-cm, as seen in FIG. 6, which is approximately 2 orders of magnitude more resistive than the highly conductive top layer.) Similar to the previous example, this semiconducting LSP configuration (Film 6) results in a substantial reduction in carbon ply damage relative to Film 4 (see Table 1). Notably, only 4 carbon plies are penetrated for Film 6 versus 7 when testing under Zone 1A conditions. In addition, Film 6 demonstrated improved performance of Film 1 based on a monolayer configuration despite Film 6 having inferior sheet resistance and slightly higher silver content. This was illustrated in the comparison of FIGS. 3(a) and (b) showing front and back side damage, respectively, to the material of Film 1, vs. FIGS. 4(a) and (b) showing the front and back side damage, respectively, to the material of Film 6. While there was slightly more font side paint damage to Film 6 as illustrated in FIG. 3(a) vs. 4(a), there was no back side damage in Film 6 as seen in FIG. 4(b).

Film 7

The film, denoted Film 7 in Table 1, was prepared in the same manner as the isolated film described in Example 2, however, the bottom was filled with 10 volume percent atomized spherical silver powder. This powder, whose mean particle size was approximately 36 microns, was selected under the consideration that the particles would act as bridges or vertical interconnects through which current could travel in the z-direction from the highly conductive top layer to the underlying carbon substrate. Volume resistivity measurements on the bottom layer formulation provide insight into the anisotropic nature of this layer. Measurements on the volume resistivity in the X-Y direction yielded a very high resistivity, i.e. $\sim 1 \times 10^{10}$ Ohm-cm which indicates poor conductance through the X-Y plane of the film; whereas, the Z-resistivity measurement yielded a volume resistivity of approximately×2.9×10$^4$ Ohm-cm showed a much greater ability to conduct charge perpendicular to the film. With regard to lightning strike performance, the Z-conductive Film 7 configuration results in a substantial reduction in carbon ply damage relative to the panel based on Film 4 (see Table 1) as also seen in the previous two semiconducting configurations. Specifically, the panel based on Film 7 exhibited a penetration depth of 2 plies versus 7 plies for the panel based on Film 4 when testing under Zone 1 conditions. Moreover, the level of protection was similar to that of Film 2 based on a monolayer of similar area weight despite Film 7's sheet resistance being approximately 70 percent higher.

TABLE 1

Summary of monolayer and bilayer films and electrical resistivity and lightning strike data on mock aircraft panels

| Property | Monolayer | | | Isolated Bilayer | | Semiconducting Bilayer | |
| --- | --- | --- | --- | --- | --- | --- | --- |
| Film Number | 1 | 2 | 3 | 4 | 5 | 6 | 7 |
| Areal Weight of Top/Bottom/Total[a] (gsm) | 201/NA/201 | 182/NA/182 | 120/NA/120 | 112/68/192 | 110/68/190 | 118/68/198 | 120/68/207 |
| Thickness of Top/Bottom Layers (microns) | 97/NA | 71/NA | 47/NA | 44/60 | 43/54 | 46/50 | 47/33 |
| Conductive Filler in Top/Bottom | Ag Flake/NA | Ag Flake/NA | Ag Flake/NA | Ag Flake/None | Ag Flake/Graphite | Ag Flake/Ag Flake | Ag Flake/Ag Powder |
| Silver Content Top/Bottom[b] (wt %) | 50/NA | 62/NA | 62/NA | 62/0 | 62/0 | 62/19 | 62/50 |
| Total Silver Content (wt %) | 47 | 58 | 56 | 37 | 36 | 43 | 54 |
| Total Silver Areal Weight (gsm) | 95 | 105 | 67 | 73 | 68 | 86 | 113 |
| Sheet Resistance of LSP Co-cured on Carbon (mΩ/square) | 20.4 | 16.8 | 33.5 | 31.7 | 24.5 | 31.7 | 28.6 |
| Total Thickness of Paint/Primer Layers (microns) | 175 | 175 | 175 | 175 | 175 | 175 | 175 |
| Zone 1A Damage Assessment | | | | | | | |
| No. of Carbon Plies Penetrated | 8 | 2 | 8 | 7 | 2 | 4 | 2 |
| Backside Failure Diameter (cm) | 3.5 | 0.0 | 0.8 | 0.0 | 0.0 | 0.0 | 0.0 |
| Delamination Diameter (cm) | 3.5 | 3.5 | 3.8 | 3.5 | 2.5 | 3.5 | 3.5 |
| Surface Damage Diameter (cm) | 14.5 | 23.0 | 13.5 | 42.0 | 52.0 | 46.0 | 38.0 |
| Zone 2A Damage Assessment | | | | | | | |
| No. of Carbon Plies Penetrated | 8 | 1 | 3 | 2 | 1 | 2 | 2 |
| Backside Failure Diameter (cm) | 1.0 | 0.0 | 0.0 | 0.0 | 0.0 | 0.0 | 0.0 |
| Delamination Diameter (cm) | 2.0 | 2.0 | 3.0 | 2.5 | 2.0 | 2.0 | 2.5 |
| Paint Damage Diameter (cm) | 4.8 | 7.0 | 5.8 | 26.0 | 15.0 | 17.0 | 46.0 |

[a]12 gsm of the total areal weight is associated with the polyester carrier veil.
[b]These values report exclude the volume that is occupied by the polyester carrier veil.

What is claimed is:

1. A protective system comprising a material comprising a first and second surface opposite one another and a thickness, the material further comprising a first protective layer comprising a low-resistivity layer disposed upon a second protective layer comprising a high-resistivity layer, wherein the ratio of the resistivity of the low-resistivity layer to the resistivity of the high-resistivity layer is at least 10, and wherein in use the protective system is disposed upon a structural layer such that the second surface is disposed along and in contact with the structural layer, and the material conducts charge from the first surface to the second surface through the thickness.

2. The protective system of claim 1, wherein the material comprises a Z-axis resistance for a 1 cm$^2$ area of between $1 \times 10^{-6}$ Ohms-cm and $1 \times 10^4$ Ohms-cm when the material comprises a thickness of between 10 and 100 microns.

3. The protective system of claim 1, further comprising at least one additional layer disposed between the first protective layer and the second protective layer and having a resistivity greater than that of the low-resistivity layer and less than that of the high-resistivity layer.

4. The protective system of claim 1, wherein at least one of the first layer and the second layer comprises a polymer filed with electrically conductive particles.

5. The protective system of claim 1, wherein at least one of the first layer and the second layer comprises a self-assembled heterogeneous composite.

6. The protective system of claim 5, wherein at least one of the first layer and the second layer does not comprise a self-assembled heterogeneous composite.

7. The protective system of claim 1, wherein the first protective layer has an electrical resistivity of no more than $1 \times 10^{-3}$ Ohm-cm.

8. The protective system of claim 1, wherein the second protective layer has an electrical resistivity of at least $1 \times 10^{-3}$ Ohm-cm.

9. The protective system of claim 8, wherein the second protective layer has an electrical resistivity of between $1 \times 10^{-3}$ Ohm-cm and $1 \times 10^6$ Ohm-cm.

10. The protective system of claim 9, wherein the second protective layer has an electrical resistivity of between $1 \times 10^{-3}$ Ohm-cm and $1 \times 10^4$ Ohm-cm.

11. The protective system of 1, wherein the ratio of resistivities is at least 100.

12. The protective system of claim 1, wherein a supportive medium is provided in at least one of the first layer, the second layer, or disposed therebetween.

13. The protective system of claim 1, where the first layer has a Z-axis thickness that is different than a Z-axis thickness of the second layer.

14. The protective system of claim 1, wherein the structural layer comprises at least one layer of carbon fiber impregnated with a resin.

15. The protective system of claim 1, wherein the structural layer comprises 6 layers of carbon fiber impregnated with a resin and the protective system is capable of dissipating the energy from at least a Zone 1A lightning strike such that no damage is apparent on the side of the carbon fiber opposite the protective system.

16. The protective system claim 1, further comprising at least one paint layer disposed upon the low-resistivity layer.

* * * * *